United States Patent
Shroff et al.

(10) Patent No.: US 9,466,569 B2
(45) Date of Patent: Oct. 11, 2016

(54) THOUGH-SUBSTRATE VIAS (TSVS) AND METHOD THEREFOR

(71) Applicant: FREESCALE SEMICONDUCTOR, INC., Austin, TX (US)

(72) Inventors: Mehul D. Shroff, Austin, TX (US); Douglas M. Reber, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/539,421

(22) Filed: Nov. 12, 2014

(65) Prior Publication Data

US 2016/0133574 A1    May 12, 2016

(51) Int. Cl.
    *H01L 23/48*    (2006.01)
    *H01L 23/532*   (2006.01)
    *H01L 21/768*   (2006.01)

(52) U.S. Cl.
    CPC ..... *H01L 23/53238* (2013.01); *H01L 21/7685* (2013.01); *H01L 21/76898* (2013.01); *H01L 23/481* (2013.01)

(58) Field of Classification Search
    CPC ........... H01L 23/53238; H01L 23/481; H01L 21/7685; H01L 21/76898
    See application file for complete search history.

(56) References Cited

U.S. PATENT DOCUMENTS

| | | | |
|---|---|---|---|
| 4,897,709 A | 1/1990 | Yokoyama et al. | |
| 5,712,510 A | 1/1998 | Bui et al. | |
| 6,197,613 B1 | 3/2001 | Kung et al. | |
| 6,488,823 B1 | 12/2002 | Chiang et al. | |
| 6,579,795 B1 | 6/2003 | Hau-Riege | |
| 6,725,433 B1 | 4/2004 | Hau-Riege et al. | |
| 7,154,184 B2 | 12/2006 | Asai et al. | |
| 7,459,786 B2 | 12/2008 | Shimazu et al. | |
| 7,598,540 B2 | 10/2009 | Doris et al. | |
| 7,964,502 B2 | 6/2011 | Dao et al. | |
| 8,178,950 B2 | 5/2012 | Dao et al. | |
| 8,188,574 B2 | 5/2012 | Angyal et al. | |
| 8,456,017 B2 | 6/2013 | Dai et al. | |
| 8,575,752 B2 | 11/2013 | Herdt et al. | |
| 8,598,714 B2 | 12/2013 | Huisinga et al. | |
| 2002/0070375 A1* | 6/2002 | Chiang | C23C 14/0036 252/512 |
| 2004/0251555 A1 | 12/2004 | Asai et al. | |
| 2006/0030143 A1* | 2/2006 | Ivanov | B82Y 30/00 438/622 |
| 2006/0113672 A1 | 6/2006 | Wang et al. | |
| 2007/0145567 A1 | 6/2007 | Ning | |

(Continued)

OTHER PUBLICATIONS

Huang et al, "Numerical Modeling and Characterization of the Stress Migration Behavior Upon Various 90 nanometer Cu/Low k Interconnects", Proceedings of the IEEE International Interconnect Technology Conference, Jun. 2-4, 2003, pp. 207-209.

(Continued)

*Primary Examiner* — Kimberly Rizkallah
*Assistant Examiner* — Maria Ligai

(57) ABSTRACT

A semiconductor device includes a semiconductor substrate having a first major surface and a second major surface opposite the first major surface. A via extends through the substrate. The via is filled with conductive material and extends to at least the first major surface of the substrate. A thermal expansion inhibitor is over and in direct contact with the via proximate the first major surface. The thermal expansion inhibitor exerts a compressive stress on the conductive material closest to the thermal expansion inhibitor compared to the conductive material at a further distance from the thermal expansion inhibitor.

18 Claims, 2 Drawing Sheets

(56) References Cited

U.S. PATENT DOCUMENTS

| | | | |
|---|---|---|---|
| 2008/0272492 | A1 | 11/2008 | Tsang |
| 2009/0032961 | A1 | 2/2009 | Feustel et al. |
| 2009/0115072 | A1 | 5/2009 | Rhyner et al. |
| 2009/0243109 | A1 | 10/2009 | Nopper et al. |
| 2010/0072588 | A1 | 3/2010 | Yang |
| 2010/0230824 | A1 | 9/2010 | Lee et al. |
| 2011/0101531 | A1* | 5/2011 | Neuilly ............ H01L 21/76838 257/751 |
| 2011/0204517 | A1 | 8/2011 | Gu et al. |
| 2012/0153480 | A1 | 6/2012 | Pfuetzner et al. |
| 2013/0161824 | A1 | 6/2013 | Choi et al. |
| 2013/0221494 | A1 | 8/2013 | Ramachandran et al. |
| 2013/0249011 | A1 | 9/2013 | Choi et al. |
| 2013/0320562 | A1 | 12/2013 | Miyajima |
| 2014/0103533 | A1 | 4/2014 | Bedell et al. |
| 2014/0117558 | A1 | 5/2014 | Boyanov |
| 2014/0264922 | A1 | 9/2014 | Chen et al. |
| 2014/0353841 | A1 | 12/2014 | Reber et al. |
| 2015/0040092 | A1 | 2/2015 | Reber et al. |
| 2015/0145120 | A1* | 5/2015 | Lee ....................... H01L 23/481 257/737 |
| 2015/0194429 | A1 | 7/2015 | Moroz et al. |
| 2015/0228555 | A1* | 8/2015 | Rabie .................... H01L 23/481 257/774 |

OTHER PUBLICATIONS

Ogawa et al, "Stress-Induced Voiding Under Vias Connected to Wide Cu Metal Leads", 40th Annual Reliability Physics Symposium Proceedings, 2002, pp. 312-321.

Wang et al, "Interfacial Stress Characterization for Stress-induced Voiding in Cu/Low-k Interconnects", Proceedings of the 12th International Symposium on the Physical and Faillure analysis of Integrated Circuits, Jun. 27-Jul. 1, 2005, pp. 96-99.

"Ion Beam Deposition", <http://en.wikipedia.org/w/index.php?title=ion_beam_deposition&printable=yes>, Accessed May 28, 2014, 2 pages.

"Electron Beam-Induced Deposition", <http://en.wikipedia.org/w/index.php?title=electron_beam-induced_deposition&printable=yes>, Accessed May 28, 2014, 5 pages.

U.S. Appl. No. 13/956,068, filed Jul. 31, 2013, entitled "Capping Layer Interface Interruptin for Stress Migration Mitigation".

Chidambaram et al, "TSV Stress Testing and Modeling for 3D IC Applications", 16th IEEE International Symposium on the Physical and Failure Analysis of Integrated Circuits, Jul. 1-10, 2009, pp. 727-730, Suzhou, Jiangsu.

U.S. Appl. No. 14/193,866, filed Feb. 28, 2014, entitled "Stress Migration Mitigation Utilizing Induced Stress Effects in Metal Trace of Integrated Circuit Device".

U.S. Appl. No. 14/292,886, filed May 31, 2014, entitled "Apparatus and Method for Placing Stressors Within an Integrated Circuit Device to Manage Electromigration Failures".

Oates et al, "Electromigration Failure Distributions of Cu/Low-k Dual-Damascene Vias: Impact of the Critical Current Density and a New Reliability Extrapolation Methodology", IEEE Transactions on Device and Materials Reliability, Jun. 2009, pp. 244-254, vol. 9, No. 2.

Ogawa et al, "Statistics of Electromigration Early Failures in Cu/Oxide Dual-Damascene Interconnects", IEEE 39th Annual International Reliability Physics Symposium, 2001, pp. 341-349, Orlando, Florida.

U.S. Appl. No. 13/907,119, filed May 31, 2013, entitled "Method for Forming an Electrical Connection Between Metal Laters".

Heryanto et al, "Study of Stress Migration and Electromigration Interaction in Copper/Low-? Interconnects", 2010, pp. 586-590.

Hall et al, "Impact of Via Interactions and Metal Slotting on Stress Induced Voiding", 46th Annual International Reliability Physics Symposium, 2008, pp. 392-398, Phoenix.

Matsuyama et al, "Stress Migration Phenomena in Narrow Copper Lines", 2006, pp. 28-30, IIRW Final Report.

Kouno et al,"Stress-Induced Voiding Under Vias Connected to "Narrow" Copper Lines", Electron Devices Meeting, 2005, 187-190.

Pathak et al., Electromigration Modeling and Full-chip Reliability Analysis for BEOL Interconnect in TSV-based 30 ICs, Department of ECE, Georgia Institute of Technology, IEEE, 2011.

Hau-Riege et al., The effect of interlevel dielectric on the critical tensile stress to void nucleation for the reliability of Cu interconnects, 2004, AIP Publishing, Journal of Applied Physics, vol. 96, Issue 10, 2004. (Cited by USPTO Examiner on U.S. Appl. No. 14/292,886 Sep. 16, 2015).

U.S. Appl. No. 14/292886, Notice of Allowance, Jul. 5, 2016, 7 pages.

U.S. Appl. No. 14/292886, Notice of Allowance, Mar. 30, 2016, 7 pages.

U.S. Appl. No. 14/292886, Office Action—Non Final Rejection, Sep. 16, 2015, 6 pages.

U.S. Appl. No. 14/292886, Office Action—Restriction/Election, Jun. 25, 2015, 7 pages.

U.S. Appl. No. 14/193866, Notice of Allowance mailed Jul. 10, 2015.

U.S. Appl. No. 14/193,866, Office Action—Non-Final Rejection mailed Jun. 1, 2015.

U.S. Appl. No. 14/193,866, Office Action—Restriction mailed Mar. 26, 2015.

* cited by examiner

THROUGH-SUBSTRATE VIAS (TSVS) AND METHOD THEREFOR

BACKGROUND

1. Field

This disclosure relates generally to integrated circuits using substrates, and more specifically, to integrated circuits having vias through the substrate.

2. Related Art

Through-substrate vias (TSVs), also called through-silicon vias because the substrate is nearly always silicon in current semiconductor manufacturing, have provided increased functionality of integrated circuits. The TSVs, however, result in manufacturing challenges and have side effects. One of the side effects is that the stress induced by a TSV affects an area around the TSV and thus alters the performance of semiconductor devices near the TSV. A solution is to simply have a design rule that prohibits placing transistors, or other elements affected by stress, near a TSV. This reduces area available for transistors and the other elements affected by stress. The seriousness of the problem varies with how many TSVs there are and how much stress they induce.

Accordingly there is a need to provide further improvement in TSVs and methods therefor.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a through-substrate via (TSV) is made with a stressor over the top of the TSV that counteracts the stress of the TSV. This allows for placing semiconductor devices closer to the TSV. The primary effect of stress on a semiconductor device is near the surface of the substrate. The stressor, being on or near the surface, is thus most effective near the surface of the substrate where the stress reduction is most beneficial. In one embodiment, the stressor may be a separately deposited layer. In another embodiment, the stressor may be formed by implanting a top portion of the TSV. This is better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
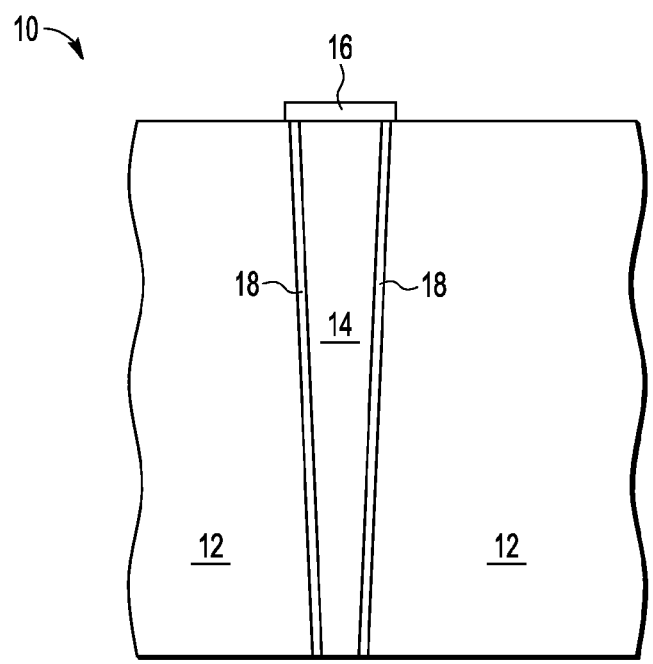
FIG. 1 is a cross section of a of a semiconductor device having a through substrate via (TSV) according to a first embodiment.

FIG. 1 is a semiconductor device 10 having a substrate 12 having a top surface where transistors are formed and a bottom surface, a through substrate via (TSV) 14 having a top surface substantially aligned with the top surface of substrate 12 and a bottom surface substantially aligned with a bottom surface of substrate 12, a thermal expansion inhibitor (TEI) 16 over the top surface of TSV 14, a liner 18 along an interface between TSV 14 and substrate 12. The top surface and the bottom surface are major surfaces and may also be considered external surfaces. TSV 14 is formed by forming an opening through substrate 12, forming liner 18 along the substrate wall of the opening, and filling the opening with a conductive material. Copper is known to be effective for the conductive material. Liner 18 may be oxide and may be deposited or grown. Also present may be a barrier layer between liner 18 and TSV 14. The conductive material is desirably very conductive so that will typically result in metal being the choice. Copper is very conductive and is commonly used as the conductor in making semiconductors when very high temperatures are not going to be used after its formation. TEI 16 may be either a conductive or non-conductive layer. In the case of TEI 16 being conductive, a via is formed of the combination of TSV 14 and TEI 16. Thus TEI 16 performs the inhibitor function on the via as either part of the via or attached to the via. TEI 16 is shown as extending slightly past the top surface of TSV 14. TEI 16 can still be effective if it does not extend completely over the top surface of TSV 14 or if it extends further past the top surface of TSV 14. Also TSV 14 can extend above the top surface of substrate 12, and also may not extend all the way to the bottom surface of substrate 12.

During temperature increases, TSV 14, in the absence of TEI 16, would cause substrate 12 in a region around TSV 14 to be under compressive stress. Copper has a coefficient of thermal expansion (CTE) significantly greater that silicon; more than 6 times greater. The material of TEI 16 is chosen to reduce the stress applied by TSV 14 to the adjacent portion of substrate 12 as heating occurs. One choice is silicon nitride that applies compressive stress to TSV 14 which itself works against the compressive stress that copper tends to apply. Also silicon nitride has a much lower CTE than copper. Silicon oxynitride and aluminum nitride are other possibilities. Conductive materials that have the desired characteristic for TEI 16 are tantalum nitride, titanium nitride, and tungsten nitride. In the case of using a dielectric such as silicon nitride, an opening in TEI 16 is required to form a contact with TSV 14. The required opening for a via through TSV 14 is very small compared to TEI 16. For example, the diameter or diagonal of the top surface of TSV 14 may be about 100 times greater than the diameter or diagonal of the opening for forming a via. With the effect of compressive stress near TSV 14 being substantially reduced, transistors can be placed closer to TSV 14 without adverse effects with the use of TEI 16 than without TEI 16. Another aspect of the result is that the uppermost portion of TSV 14, due to being placed under compressive stress by TEI 16, may have a higher density than does the portion of the TSV 14 below the uppermost portion.

Figure 2:
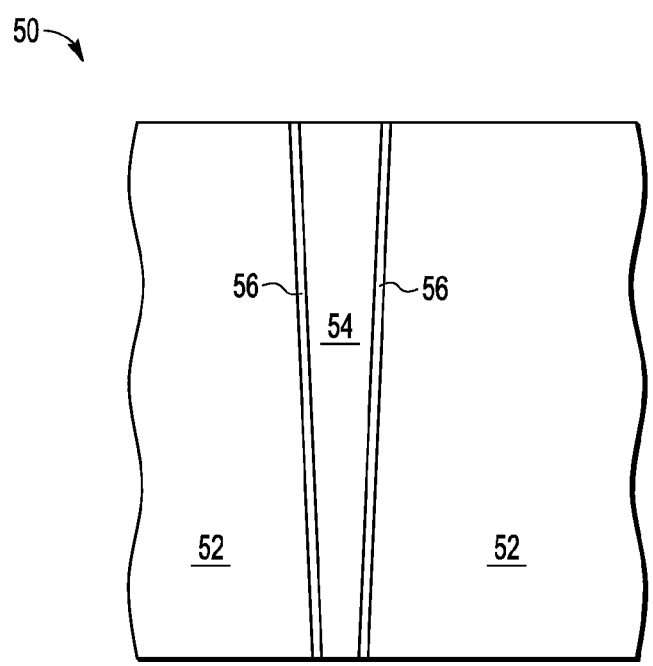
FIG. 2 is a cross section of a semiconductor device having a TSV at a stage in processing according to a second embodiment.

Shown in FIG. 2 is a semiconductor device 50 having a substrate 52, a TSV 54 having a top surface that may be substantially aligned with a top surface of substrate 52 and a bottom surface that may be substantially aligned with a bottom surface of substrate 52, and a liner 56 along an interface between TSV 54 and substrate 52. This is the same structure as shown in FIG. 1, but without TEI 16, and the top surface of substrate 52 is where transistors are formed. TSV 54 is formed by forming an opening through substrate 52, forming liner 56 along the substrate wall of the opening, and filling the opening with a conductive material which may be copper. Liner 56 may be oxide and may be deposited or grown. A barrier layer may be formed between liner 56 and TSV 54. TSV 54 may also extend above the top surface of substrate 52, and TSV 54 also may not extend all the way to the bottom surface of substrate 52.

Figure 3:
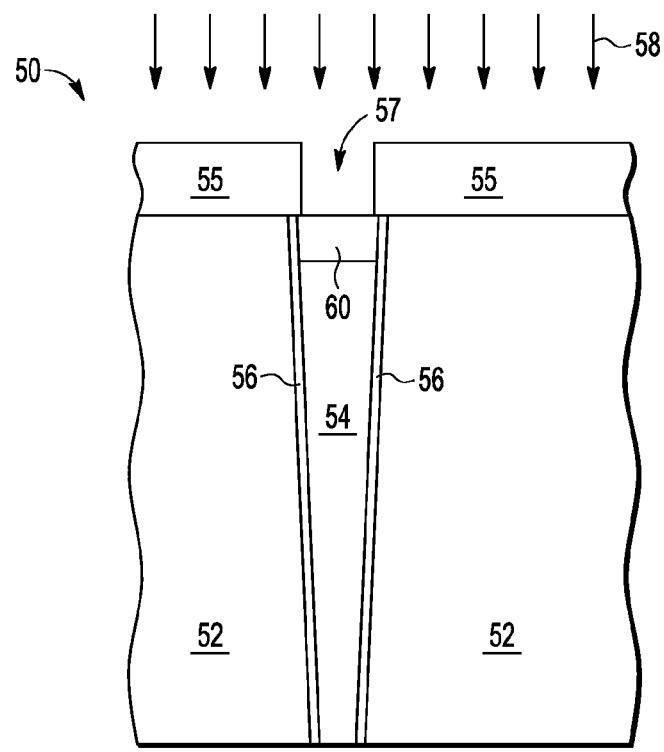
FIG. 3 is a cross section of the semiconductor device of FIG. 2 at a subsequent stage in processing.

Shown in FIG. 3 is semiconductor device 50 after forming a masking layer 55 having an opening 57 and receiving an implant 58 of the same material as that of TSV 54 that forms a thermal expansion inhibitor (TEI) 60 in the top surface of semiconductor device 50 aligned with opening 57 and thus in a top portion of TSV 54. The implanted material may be in the form of ions. In the case of TSV 54 being copper, implant 58 is of copper. Implant 58 forming TEI 60 in TSV 54 has the effect of increasing the density of copper to the depth of implant 58 so that TEI 60 has a higher concentration of copper than TSV 54 that is below TEI 60. Opening 57 should not extend past the top surface of TSV 54 so that no portion of substrate 52 is exposed to implant 58.

Figure 4:
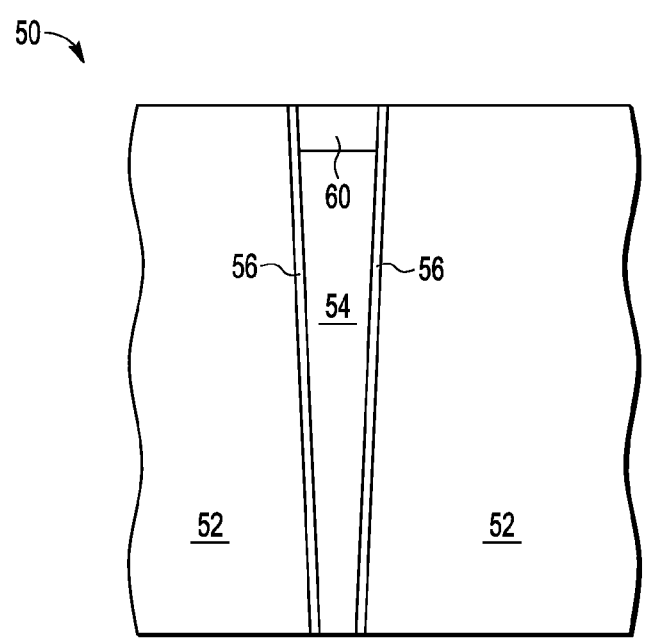
FIG. 4 is a cross section of the semiconductor device of FIG. 3 at a subsequent stage in processing.

Shown in FIG. 4 is semiconductor device 50 after removing masking layer 55. With such processing and other processing that includes heat, the result of TEI 60 is that grains of copper exist in the lower portion, which is the portion below TEI 60, of TSV 54 and in TEI 60. The grain density is higher in TEI 60 than the lower portion of TSV 54. The average space between grains in TEI 60 is less than the average space between grains of TSV 54 below TEI 60. The effect of TEI 60 is that it has a lower CTE than TSV 54 below it. Thus TEI 60 inhibits the stress applied by TSV 54 when TSV 54 increases in temperature. Copper in its normal state is tensile but TEI 60 is less tensile or more compressive which also has the effect of offsetting the compressive effect of TSV 54 on substrate 52. Although the increase in grain density for TEI 60 may change its conductivity, the change is small. The conductance of TEI 60 is greater than that of tantalum nitride, titanium nitride, and tungsten nitride. TSV 54 includes TEI 60 which is similar to the case shown in FIG. 1 in which TEI 16 is conductive so that the overall via, from one end to the other, is the combination of TEI 16 and TSV 14. The overall via in FIG. 4, which is TSV 54, is through TEI 60.

By the nature of the implant, the density of copper is greater in TEI 60 than in TSV 54 below it. Due to the compression applied to the portion of TSV 54 immediately below TEI 60, that portion of TSV immediately below TEI 60 will have a higher density than that of TSV 54 further below TEI 60. The result is that in both the resulting via in FIG. 1 and FIG. 4, there will be less compressive stress applied to the top portion of substrate 12 and substrate 52 so that transistors can be placed more closely to TSV's 14 and 54 without deleterious effects. The offset in stress to the top portion of the overall via, due to the TEI, may be 30% or more. A TEI, such as TEI 16 or 60, may also be formed on the bottom surface of substrate 12 or 52 as attached to or part of the overall via in the manner shown in FIGS. 1-4 for the top surface.

By now it is apparent that there has been described a semiconductor device having a semiconductor substrate having a first major surface and a second major surface opposite the first major surface. The semiconductor device further includes a via through the semiconductor substrate, the via is filled with conductive material and extends to at least the first major surface of the semiconductor substrate. The semiconductor device further includes a thermal expansion inhibitor over and in direct contact with the via proximate the first major surface, the thermal expansion inhibitor exerts a compressive stress on the conductive material closest to the thermal expansion inhibitor compared to the conductive material at a further distance from the thermal expansion inhibitor. The semiconductor device may have a further characterization by which the thermal expansion inhibitor overlaps the first major surface around an outermost perimeter of the via. The semiconductor device may have a further characterization by which the thermal expansion inhibitor is within a perimeter of an opening for the via. The semiconductor device may have a further characterization by which the thermal expansion inhibitor is contained within an opening for the via. The semiconductor device may have a further characterization by which the thermal expansion inhibitor is a dielectric material and includes an opening filled with conductive material over a portion of the via. The semiconductor device may have a further characterization by which the thermal expansion inhibitor includes copper having a first density and the conductive material includes copper having a second density that is lower than the first density. The semiconductor device may have a further characterization by which the via extends to the second major surface of the substrate, further including a second thermal expansion inhibitor over and in direct contact with the via proximate the second major surface, the second thermal expansion inhibitor induces a compressive stress on the via. The semiconductor device may have a further characterization by which the thermal expansion inhibitor is made of a material that includes one of a group consisting of: tantalum nitride, titanium nitride, and tungsten nitride.

Also disclosed is a method of forming a semiconductor device including forming an opening in a semiconductor substrate, wherein the opening extends to a first external surface of the substrate. The method further includes filling at least a portion of the opening with a conductive material to form a through-substrate via (TSV). The method further includes fabricating a thermal expansion inhibitor over and in direct contact with the conductive material proximate the first external surface of the semiconductor substrate, wherein compressive stress imparted by the thermal expansion inhibitor offsets tensile stress in a portion of the conductive material proximate the first external surface. The method may have a further characterization by which the thermal expansion inhibitor includes copper and fabricating the thermal expansion inhibitor includes ion implanting the conductive material proximate the first external surface with additional copper. The method may have a further characterization by which fabricating the thermal expansion inhibitor includes depositing a material that is specifically tuned to impart a desired level of the compressive stress. The method may have a further characterization by which the material for the thermal expansion inhibitor is one of a group consisting of: tantalum nitride, titanium nitride, and tungsten nitride. The method may further include forming the opening in a semiconductor substrate includes extending the opening to a second external surface of the semiconductor substrate and fabricating a second thermal expansion inhibitor over and in direct contact with the conductive material proximate the second external surface, the second thermal expansion inhibitor induces another compressive stress on the conductive material.

Disclosed also is a semiconductor device including a semiconductor substrate. The semiconductor device further includes an opening formed through the semiconductor substrate and filled with a first conductive material. The semiconductor device further includes a first thermal expansion inhibitor over a first end portion of the first conductive material, wherein the first thermal expansion inhibitor exerts a compressive force on the first end portion of the first conductive material. The semiconductor device may further include a second thermal expansion inhibitor over a second end portion of the first conductive material wherein density of the first conductive material is higher at the second end portion of the first conductive material than at the intermediate portion of the first conductive material, and the second thermal expansion inhibitor exerts a compressive force on the second end portion of the first conductive material. The semiconductor device may have a further characterization by which the second thermal expansion inhibitor is made of a different material than the first thermal expansion inhibitor. The semiconductor device may have a further characterization by which the first thermal expansion inhibitor includes one of a group consisting of tantalum nitride, titanium nitride, and tungsten nitride. The semiconductor device may have a further characterization by which the first thermal expansion inhibitor includes ion implanted copper and the first conductive material includes copper. The semiconductor device may have a further characterization by which the first thermal expansion inhibitor includes a dielectric material, and the dielectric material includes an opening over a section of the first end portion, wherein the opening in the dielectric material is filled with a second conductive material that is in electrical contact with the first conductive material. The semiconductor device may have a further characterization by which the first thermal expansion inhibitor exerts compressive stress that offsets at least 30 percent of tensile stress in the first end portion of the first conductive material.

Although the invention is described herein with reference to specific embodiments, various modifications and changes can be made without departing from the scope of the present invention as set forth in the claims below. For example, materials used for the stressor and for the implant can be varied with the corresponding changes in stress. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
   a semiconductor substrate having a first major surface and a second major surface opposite the first major surface;
   a via through the semiconductor substrate, the via is filled with conductive material and extends to at least the first major surface of the semiconductor substrate;
   a thermal expansion inhibitor over and in direct contact with the via proximate the first major surface, the thermal expansion inhibitor exerts a compressive stress on the conductive material closest to the thermal expansion inhibitor compared to the conductive material at a further distance from the thermal expansion inhibitor, wherein the thermal expansion inhibitor includes copper having a first density and the conductive material includes copper having a second density that is lower than the first density.

2. The semiconductor device of claim 1 wherein:
   the thermal expansion inhibitor overlaps the first major surface around an outermost perimeter of the via.

3. The semiconductor device of claim 1 wherein:
   the thermal expansion inhibitor is within a perimeter of an opening for the via.

4. The semiconductor device of claim 1 wherein:
   the thermal expansion inhibitor is contained within an opening for the via.

5. The semiconductor device of claim 1 wherein:
   the thermal expansion inhibitor is a dielectric material and includes an opening filled with conductive material over a portion of the via.

6. The semiconductor device of claim 1, wherein the via extends to the second major surface of the substrate, further comprising:
   a second thermal expansion inhibitor over and in direct contact with the via proximate the second major surface, the second thermal expansion inhibitor induces a compressive stress on the via.

7. The semiconductor device of claim 1, wherein the thermal expansion inhibitor is made of a material that includes one of a group consisting of: tantalum nitride, titanium nitride, and tungsten nitride.

8. A semiconductor device comprising:
   a semiconductor substrate;
   an opening formed through the semiconductor substrate and filled with a first conductive material; and
   a first thermal expansion inhibitor over a first end portion of the first conductive material, wherein the first thermal expansion inhibitor exerts a compressive force on the first end portion of the first conductive material, wherein the first thermal expansion inhibitor includes copper having a first density and the conductive material includes copper having a second density that is lower than the first density.

9. The semiconductor device of claim 8 further comprising:
   a second thermal expansion inhibitor over a second end portion of the first conductive material wherein density of the first conductive material is higher at the second end portion of the first conductive material than at the intermediate portion of the first conductive material, and the second thermal expansion inhibitor exerts a compressive force on the second end portion of the first conductive material.

10. The semiconductor device of claim 9 wherein the second thermal expansion inhibitor is made of a different material than the first thermal expansion inhibitor.

11. The semiconductor device of claim 8 wherein the first thermal expansion inhibitor includes one of a group consisting of tantalum nitride, titanium nitride, and tungsten nitride.

12. The semiconductor device of claim 8 wherein the first thermal expansion inhibitor includes ion implanted copper and the first conductive material includes copper.

13. The semiconductor device of claim 8 wherein the first thermal expansion inhibitor includes a dielectric material, and the dielectric material includes an opening over a section of the first end portion, wherein the opening in the dielectric material is filled with a second conductive material that is in electrical contact with the first conductive material.

14. The semiconductor device of claim 8 wherein the first thermal expansion inhibitor exerts compressive stress that offsets at least 30 percent of tensile stress in the first end portion of the first conductive material.

15. A semiconductor device comprising:
   an opening formed in a semiconductor substrate, wherein the opening extends to a first external surface of the substrate;
   at least a portion of the opening filled with a conductive material to form a through-substrate via (TSV); and
   a thermal expansion inhibitor fabricated over and in direct contact with the conductive material proximate the first external surface of the semiconductor substrate, wherein compressive stress imparted by the thermal expansion inhibitor offsets tensile stress in a portion of the conductive material proximate the first external surface, wherein the thermal expansion inhibitor includes copper and the thermal expansion inhibitor comprises:
   ion implanted in the conductive material proximate the first external surface with additional copper.

16. The semiconductor device of claim 15 wherein the thermal expansion inhibitor comprises:
   a material that is specifically tuned to impart a desired level of the compressive stress.

17. The semiconductor device of claim 16 wherein the material for the thermal expansion inhibitor is one of a group consisting of: tantalum nitride, titanium nitride, and tungsten nitride.

18. The semiconductor device of claim 15 further comprising:
   the opening formed in the semiconductor substrate extends the opening to a second external surface of the semiconductor substrate; and
   a second thermal expansion inhibitor fabricated over and in direct contact with the conductive material proximate the second external surface, the second thermal expansion inhibitor induces another compressive stress on the conductive material.

\* \* \* \* \*